US007952379B2

(12) United States Patent
Kwak

(10) Patent No.: US 7,952,379 B2
(45) Date of Patent: May 31, 2011

(54) SUBSTRATE TESTING DEVICE AND METHOD THEREOF

(75) Inventor: Wonkyu Kwak, Yongin-si (KR)

(73) Assignee: Samsung Mobile Display Co., Ltd., Suwon-si, Gyeonggi-do (KR)

( * ) Notice: Subject to any disclaimer, the term of this patent is extended or adjusted under 35 U.S.C. 154(b) by 451 days.

(21) Appl. No.: 11/905,908

(22) Filed: Oct. 5, 2007

(65) Prior Publication Data

US 2008/0169822 A1 Jul. 17, 2008

(30) Foreign Application Priority Data

Jan. 15, 2007 (KR) ........................ 10-2007-0004432

(51) Int. Cl.
*G01R 31/00* (2006.01)

(52) U.S. Cl. ........................................................ 324/770

(58) Field of Classification Search ............... 324/158.1, 324/770; 345/76, 82, 904; 315/169.3; 327/72
See application file for complete search history.

(56) References Cited

U.S. PATENT DOCUMENTS

| | | | | |
|---|---|---|---|---|
| 4,363,977 | A * | 12/1982 | Tsuda et al. | 327/73 |
| 5,017,914 | A * | 5/1991 | Uchida et al. | 345/89 |
| 5,523,875 | A * | 6/1996 | Morris | 398/209 |
| 5,752,171 | A * | 5/1998 | Akiya | 455/126 |
| 6,681,100 | B1 * | 1/2004 | Ge | 455/78 |
| 6,843,597 | B1 * | 1/2005 | Li et al. | 375/345 |
| 6,937,233 | B2 | 8/2005 | Sakuma et al. | |
| 7,091,793 | B2 * | 8/2006 | Bardsley et al. | 330/308 |
| 7,129,939 | B2 * | 10/2006 | Toyozawa et al. | 345/211 |
| 7,342,566 | B2 * | 3/2008 | Ha et al. | 345/100 |
| 7,583,261 | B2 | 9/2009 | Shirasaki et al. | |
| 7,586,254 | B2 | 9/2009 | Kwak et al. | |
| 7,859,492 | B2 | 12/2010 | Kohno | |
| 2001/0048322 | A1 * | 12/2001 | Koizumi | 326/81 |
| 2004/0207593 | A1 * | 10/2004 | Ha et al. | 345/100 |
| 2006/0007249 | A1 | 1/2006 | Reddy et al. | |
| 2006/0244476 | A1 * | 11/2006 | Zhang et al. | 324/770 |
| 2007/0046590 | A1 * | 3/2007 | Umezaki et al. | 345/76 |
| 2007/0152935 | A1 | 7/2007 | Maede et al. | |
| 2007/0211011 | A1 * | 9/2007 | Lee | 345/100 |
| 2008/0238936 | A1 * | 10/2008 | Kim | 345/618 |
| 2009/0096770 | A1 * | 4/2009 | Kawabe | 345/204 |
| 2010/0007369 | A1 * | 1/2010 | Kwak | 324/770 |

FOREIGN PATENT DOCUMENTS

| | | | |
|---|---|---|---|
| EP | 1 349 139 | A | 10/2003 |
| JP | 2002-297098 | A | 10/2002 |
| JP | 2003-015613 | A | 7/2003 |
| JP | 2003-280590 | A | 10/2003 |
| JP | 2005-338769 | A | 12/2005 |
| JP | 2006-085169 | A | 3/2006 |
| JP | 2006-349966 | A | 12/2006 |
| JP | 2008-122848 | A | 5/2008 |
| KR | 10-2006-0135862 | A | 12/2006 |
| WO | WO 2004/114273 | A | 12/2004 |
| WO | WO 2005/022500 | A | 3/2005 |
| WO | WO 2005/122120 | A | 12/2005 |

* cited by examiner

*Primary Examiner* — Jermele M Hollington
(74) *Attorney, Agent, or Firm* — Lee & Morse, P.C.

(57) ABSTRACT

Exemplary embodiments relate to a substrate testing device having a comparator adapted to compare a power supply voltage supplied by a power supply voltage line with a dropped power supply voltage detected by a power supply voltage detection line and to output a voltage difference, and a level shifter circuit adapted to compensate a data voltage with a voltage up to an amount equal to the voltage difference output from the comparator and to supply the data voltage to a display panel.

24 Claims, 5 Drawing Sheets

SUBSTRATE TESTING DEVICE AND METHOD THEREOF

BACKGROUND OF THE INVENTION

1. Field of the Invention

Exemplary embodiments relate to a substrate testing device and a method thereof.

2. Description of the Related Art

Generally, after panels of a plurality of organic light emitting diode (OLED) displays are formed on a single substrate, the panels may be divided into respective organic light emitting displays. In order to reduce time for testing, e.g., a test for determining whether the organic light emitting display formed on the substrate may have a defect, the panels may be tested before the substrate may be scribed.

FIG. 7 illustrates a view of a substrate of a conventional organic light emitting display.

Referring to FIG. 7, the conventional substrate 100 may be provided with a plurality of organic light emitting display panels 110 (hereinafter referred to as a "display panel"). The substrate 100 may be supplied with a first power supply voltage ELVDD and a second power supply voltage ELVSS. The substrate 100 may also be supplied with a light emission control signal Em and a data signal DataR,G,B (not shown). The data signal DataR,G,B and the light emission control signal Em may be supplied to drives (not shown) formed on the respective display panels 110. A data drive supplied with the data signal DataR,G,B may sequentially supply the data signal DataR,G,B to the display panel 110. A light emission control drive supplied with the light emission control signal Em may sequentially supply the light emission control signal Em to the display panel 110. Then, OLEDs formed on the respective display panels 110 may display a predetermined image in correspondence to the data signal DataR,G,B.

A test for determining whether each display panel 110 may have a defect in its brightness, color coordinate and color temperature may be performed. That is, each display panel 110 may be tested for whether the brightness, the color coordinate and the color temperature has the same properties after applying the same data signal DataR,G,B to each display panel 110 on the substrate 100, e.g., the brightness, the color coordinate and the color temperature of each display panel 110 may be measured by a test equipment for each display panel 110. However, a problem may arise in that a considerable amount of time may be required for measuring the brightness, color coordinate and color temperature for each display panel 110, and compensating the brightness, color coordinate and color temperature of each display panel 110 identically. Another problem may be that if a circuit wiring constituting the display panel 110 is changed or a size of the display panel 110 is changed, then the testing equipment should also be changed (or a new test should be performed). Moreover, because each display panel 110 may be separately tested, testing time will be increased, which may lead to increased cost in manufacturing and reduced testing efficiency.

SUMMARY OF THE INVENTION

Exemplary embodiments are therefore directed to a substrate testing device, which substantially overcome one or more of the problems due to the limitations and disadvantages of the related art.

It is therefore a feature of an exemplary embodiment to provide a substrate testing device and a method thereof that may measure and compensate a brightness by a detection compensation device without measuring the brightness for each display panel.

It is therefore another feature of an exemplary embodiment to provide a substrate testing device and a method thereof that may measure and compensate a brightness by a detection compensation device without measuring the brightness, even when a circuit wiring constituting an organic light emitting display panel is changed or a size of an organic light emitting display panel is changed.

It is therefore yet another feature of an exemplary embodiment to provide a substrate testing device and method thereof that may allow testing the substrate by a detection compensation device integrated into the substrate without a separate equipment, i.e., an equipment for testing an organic light emitting display panel.

At least one of the above and other features and advantages of exemplary embodiment may be realized by providing a substrate testing device having a comparator adapted to compare a power supply voltage supplied by a power supply voltage line with a dropped power supply voltage detected by a power supply voltage detection line and to output a voltage difference, and a level shifter circuit adapted to compensate a data voltage with a voltage up to an amount equal to the voltage difference output from the comparator and to supply the data voltage to a display panel.

The substrate testing device may include an initialization level shifter circuit which may compensate an initialization voltage with a voltage up to an amount equal to the voltage difference output from the comparator and may supply the initialization voltage to the panel. The initialization voltage may be a voltage which may be transferred to a pixel circuit of the display panel. The data voltage may be a voltage which may be transferred to a pixel circuit of the display panel.

The display panel may be electrically connected with the power supply voltage, the initialization voltage and the data voltage. The power supply voltage detection line may be electrically connected with the power supply voltage line of the display panel.

The substrate testing device may include a substrate on which a plurality of display panels may be arranged in a matrix. The comparator, the level shifter circuit and the initialization level shifter circuit may be integrated into the substrate.

The data voltage may be a red data voltage, a green data voltage and a blue data voltage.

The substrate testing device may include a comparator switch for switching the comparator.

The substrate testing device may include a voltage switch for switching the level shifter circuit.

The substrate testing device may include an initialization switch for switching the initialization level shifter circuit.

The substrate testing device may include a voltage difference holder for holding a voltage output from the comparator.

At least one of the above and other features and advantages of exemplary embodiment may be realized by providing a method for testing a substrate including detecting a power supply voltage of a substrate, detecting a dropped power supply voltage of the substrate, comparing and outputting the power supply voltage with the dropped power supply voltage, and compensating a data voltage with a voltage up to an amount equal to the output voltage.

The method may include comparing the power supply voltage with the dropped power supply voltage and outputs a voltage difference.

The method may include compensating an initialization voltage with a voltage up to an amount equal to the output voltage. The compensating the data voltage may compensate all of a red data voltage, a green data voltage and a blue data voltage. The compensating the data voltage with a voltage up to an amount equal to the output voltage outputs a compensated data voltage which may be produced by downshifting a voltage difference between the power supply voltage and the dropped power supply voltage in a level shifter.

The method may include switching the comparator after compensating the data voltage with a voltage up to an amount equal to the output voltage.

The method may include switching the level shifter circuit after compensating the data voltage with a voltage up to an amount equal to the output voltage.

The method may include switching the initialization level shifter after compensating the data voltage with a voltage up to an amount equal to the output voltage.

The method may include outputting a compensated initialization voltage which may be produced by downshifting a voltage difference between the power supply voltage and the dropped power supply voltage in an initialization level shifter.

The method may include comparing the power supply voltage with the dropped power supply voltage, and holding a voltage difference, so as to output a constant voltage after compensating the data voltage with a voltage up to an amount equal to the output voltage.

The method may include applying the compensated data voltage to a panel after compensating the data voltage with a voltage up to an amount equal to the output voltage.

BRIEF DESCRIPTION OF THE DRAWINGS

The above and other features and advantages of the exemplary embodiments will become more apparent to those of ordinary skill in the art by describing in detail exemplary embodiments thereof with reference to the attached drawings, in which.

DETAILED DESCRIPTION OF THE INVENTION

Figure 1:
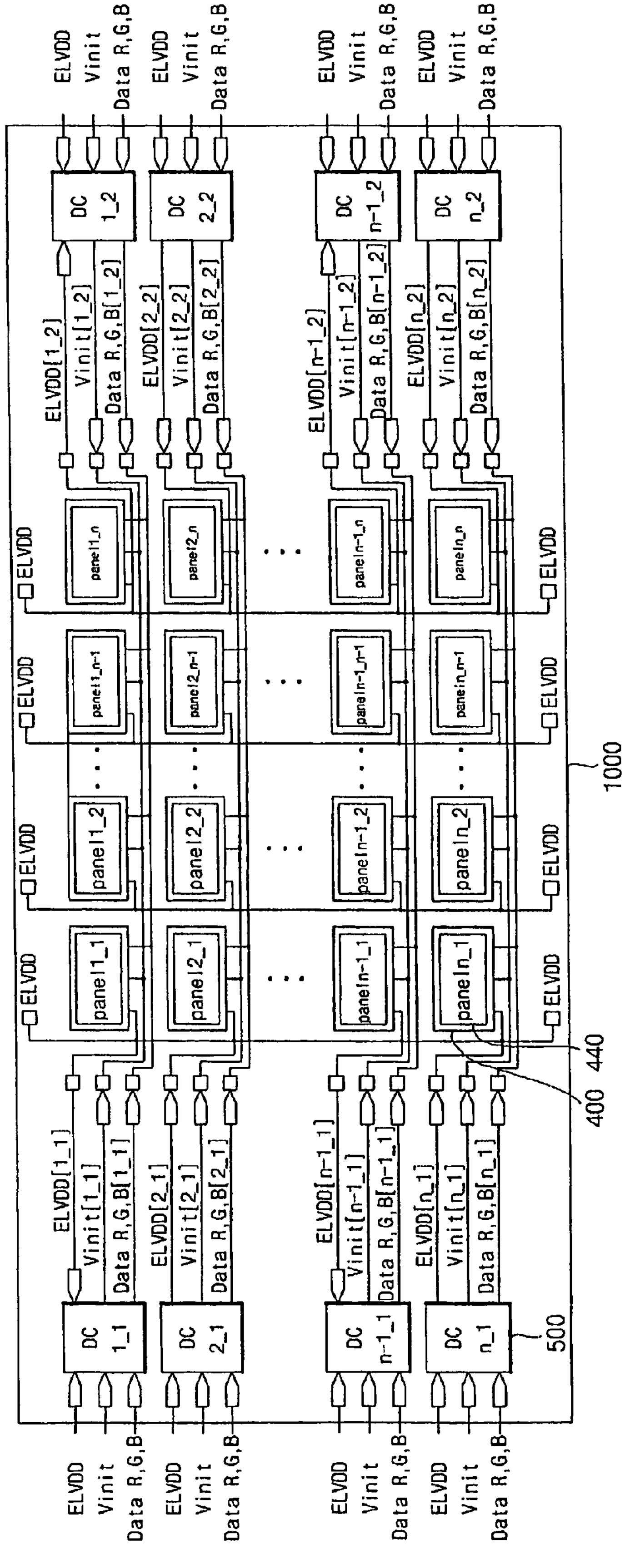
FIG. 1 illustrates a block diagram of a substrate testing device according to an exemplary embodiment.

Korean Patent Application No. 10-2007-0004432, filed on Jan. 15, 2007, in the Korean Intellectual Property Office, and entitled: "Substrate Test Device and Method Thereof," is incorporated by reference herein in its entirety.

Exemplary embodiments will now be described more fully hereinafter with reference to the accompanying drawings. The invention may, however, be embodied in different forms and should not be construed as limited to the embodiments set forth herein. Rather, these exemplary embodiments are provided so that this disclosure will be thorough and complete, and will fully convey the scope of the invention to those skilled in the art. Like reference numerals refer to like elements throughout.

FIG. 1 illustrates a block diagram of a substrate testing device 1000 according to an example embodiment.

As shown in FIG. 1, the substrate testing device 1000 may include detection compensation (DC) devices 500 and organic light emitting displays 400, including organic light emitting display panels 440 (hereinafter referred to as a "display panels"). The display panels 440 may be arranged on a substrate in a matrix.

The detection compensation (DC) devices 500 may be arranged in a left column DC1_1 to DCn_1 and a right column DC1_2 to DCn_2. The first left detection compensation device DC 1_1 may receive a first left power supply voltage ELVDD[1_1], an initialization voltage Vinit and a data voltage DataR,G,B. The first left detection compensation device DC 1_1 may further produce a first left initialization voltage Vinit[1_1] and a first left data voltage DataR,G,B[1_1]. The left first detection compensation DC1_1 to a nth left detection compensation DCn_1 and a first right detection compensation DC1_2 to a nth right detection compensation DCn_2 may have the same structure, as will be discussed below with reference to FIG. 4.

If the power supply voltage ELVDD is dropped by a voltage difference (ΔV), then the detection compensation device 500 may prevent and/or reduce a lowering of the brightness due to a voltage drop (IR_Drop) by compensating the data voltage DataR,G,B with a voltage as much as the voltage difference ΔV. Furthermore, if the power supply voltage ELVDD is dropped by the voltage difference ΔV upon applying the initialization voltage Vinit, then the detection compensation device 500 may identically initialize a voltage of a capacitive element (C1) by compensating the initialization voltage Vinit with a voltage as much as the voltage difference ΔV. In other words, the detection compensation device 500 may reduce a considerable amount of time required for measuring a brightness of each display panel 440, and may control and compensate the data voltage DataR,G,B and the initialization voltage Vinit, respectively, to compensate the brightness of each display panel 440. Moreover, the detection compensation device 500 may be installed in the substrate testing device 1000, and may test the substrate by using a separate device. Alternatively, the detection compensation device 500 may be integrated into the same substrate as the display panel 440, and may test the substrate without using a separate device. Furthermore, the detection compensation device 500 may not separately measure and compensate the brightness difference produced by the voltage drop IR Drop of each display panel 440, but by the detection compensation device 500.

The organic light emitting displays 400 may receive an output signal of the detection compensation, e.g., a left initialization voltage Vinit[1_1], Vinit[2_1], . . . , Vinit[n_1], a right initialization voltage Vinit[1_2], Vinit[2_2], . . . , Vinit [n_2], a left data voltage DataR,G,B[1_1], DataR,G,B[2_1], . . . , DataR,G,B[n_1], and a right data voltage DataR,G,B[1_2], DataR,G,B[2_2], . . . , DataR,G,B[n_2], so that the brightness may be compensated. As a result, the display panels 440 may emit light with the same brightness. Furthermore, the power supply voltage ELVDD may be simultaneously supplied at both ends, e.g., the upper and lower ends. This may reduce the occurrence of a brightness difference between the uppermost panel and the lowermost panel (due to the voltage drop IR Drop) because a conventional power supply voltage ELVDD may be supplied at only the upper end.

Figure 2:
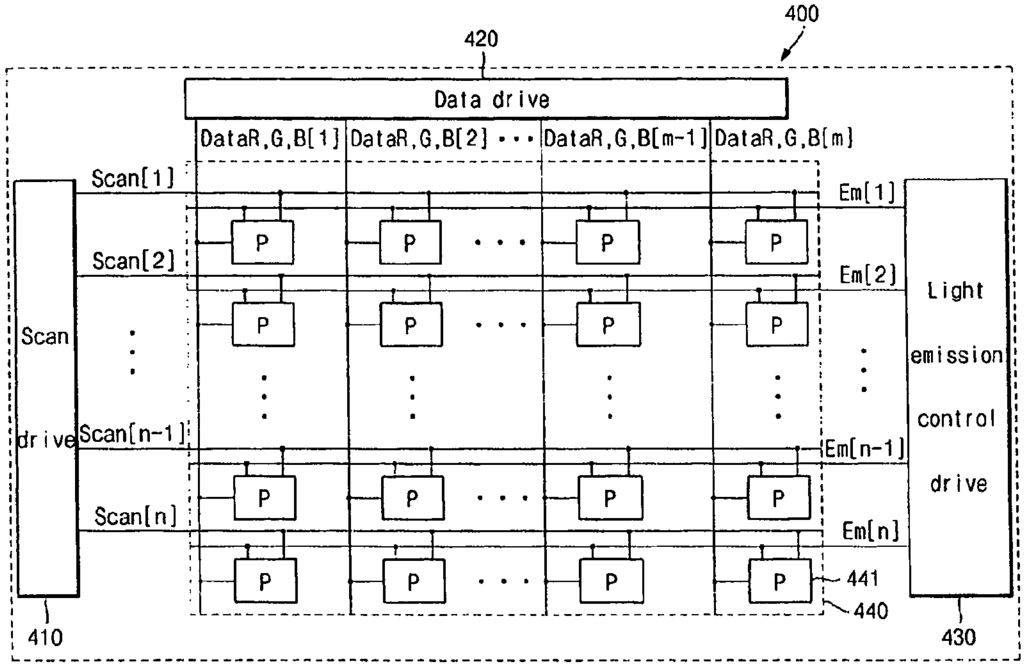
FIG. 2 illustrates a block diagram of an organic light emitting display according to an exemplary embodiment.

FIG. 2 illustrates a block diagram of an organic light emitting display 400 according to an example embodiment.

Referring to FIG. 2, the organic light emitting display 400 may include a scan drive 410, a data drive 420, a light emission control drive 430, and display panels 440.

The scan drive 410 may sequentially supply a scan signal to the display panel 440 through a plurality of scan lines Scan [1], Scan[2], . . . , Scan[n].

The data drive 420 may sequentially supply a data signal to the display panel 440 through a plurality of data lines DataR, G,B[1], DataR,G,B[2], . . . , DataR,G,B[m].

Figure 3:
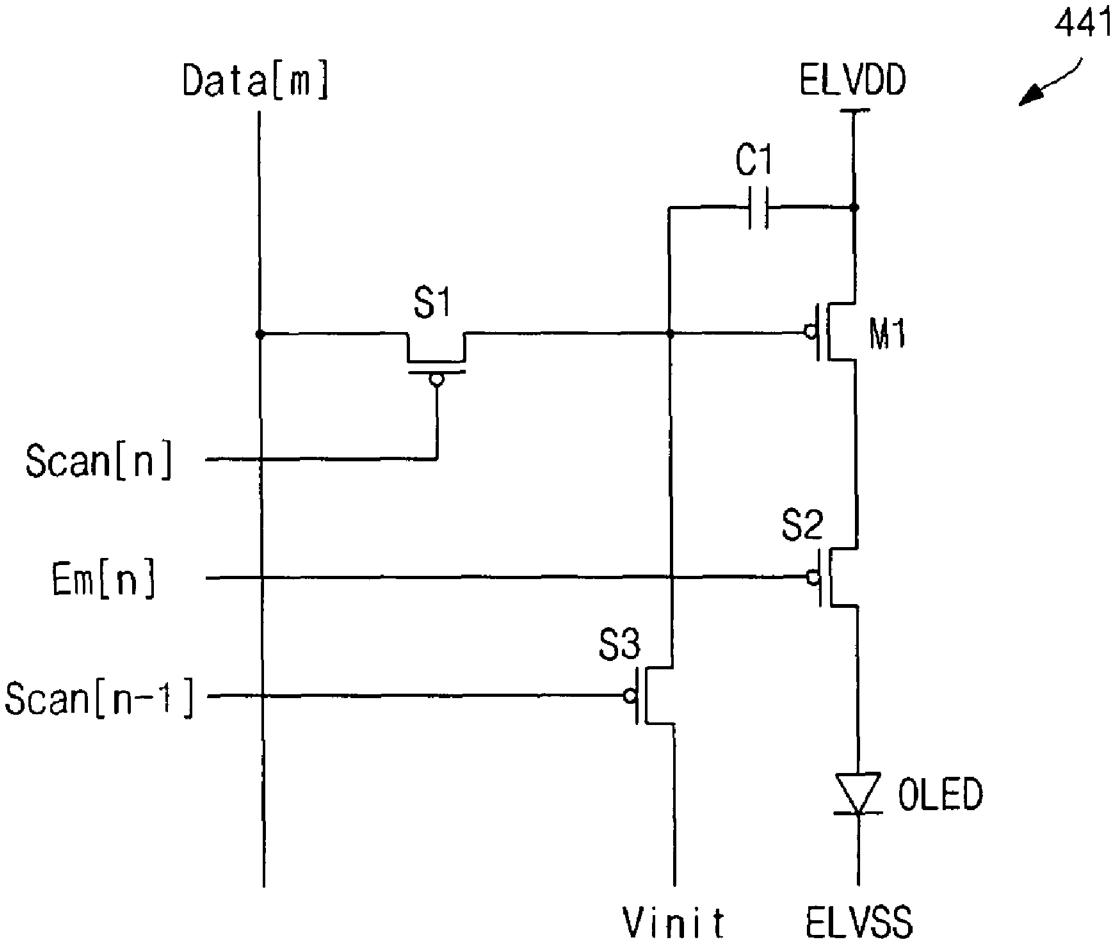
FIG. 3 illustrates a circuit diagram of a pixel circuit of an organic light emitting display.

The light emission control drive 430 may sequentially supply a light emission control signal to the display panel 440 through a plurality of light emission control lines Em[1], Em[2], . . . , Em[n]. Furthermore, the light emission control drive 430 may control a pulse width of the light emission control signal, and may control the number of pulses of the light emission control signal occurring in one zone. A pixel circuit 441 (as shown in FIG. 3) connected with the light emission control lines Em[1], Em[2], . . . , Em[n] may receive the light emission control signal, and may determine the time for allowing a current produced in the pixel circuit 441 to flow to a light emitting element. Thus, the display panel 440 may include N×M pixel circuits 441.

Further, the display panel 440 may include the scan lines Scan[1], Scan[2], . . . , Scan[n] and the light emission control lines Em[1], Em[2], . . . , Em[n], which may be arranged in a column direction. The scan lines Scan[1], Scan[2], . . . , Scan[n] and the light emission control lines Em[1], Em[2], . . . , Em[n] may further include the data lines DataR, G,B[1], DataR,G,B[2], . . . , DataR,G,B[m], which may be arranged in a row direction, and the pixel circuit 441, which may be defined by the scan lines Scan[1], Scan[2], . . . , Scan[n], the data lines DataR,G,B[1], DataR,G,B[2], . . . , DataR,G,B[m] and the light emission control lines Em[1], Em[2], . . . , Em[n].

In an exemplary embodiment, the pixel may be formed on a pixel area, which may be defined by neighboring two scan lines Scan (or light emission control lines Em) and neighboring two data lines DataR,G,B. Further, the scan lines Scan[1], Scan[2], . . . , Scan[n] may be supplied with the data signal from the data drive 420, and the light emission control lines Em[1], Em[2], . . . , Em[n] may be supplied with the light emission control signal from the light emission control drive 430.

Referring back to FIG. 1, the organic light emitting display 400 may be tested for aging and an estimation of image quality before producing a product. The aging process may prevent and/or reduce an initial examination by the user for detecting defects and test the reliability of the product immediately thereafter. Further, the aging process may include a transistor (TR) aging for aging of a transistor, a forward aging and a reverse aging for aging of the organic light emitting display 400. The forward aging may apply a forward current to the organic light emitting display 400, and the reverse aging may improve service life and efficiency by applying a reverse current to the organic light emitting display 400.

The estimation of image quality may be to test whether there may be a defect in the display panel 440 by applying the same data voltage to the substrate. The estimation of image quality may include a method for testing whether there may be a defect in the brightness, color coordinate and color temperature. Further, the method may set each display panel 440 to have the same brightness by controlling the data voltage applied thereto, after applying the same data voltage to each display panel 440 of the substrate, and then measuring the brightness by a measuring equipment, for example. Further, the method may set the color coordinate and the color temperature to the same color coordinate and the color temperature by a compensating equipment after applying the same data voltage to each display panel 440 of the substrate, and then measuring the color coordinate and color temperature by a camera equipment, for example.

The estimation of image quality may be performed after completing the aging procedure. Further, in a forward aging, which may apply the forward current to the organic light emitting display 400 for a sufficient amount of time, the amount of the voltage drop IR Drop of each display panel 440 may increase.

FIG. 3 illustrates a pixel circuit 441 among N×M pixel circuits for driving the organic light emitting display 400. Referring to FIG. 3, a drive transistor M1 may be connected with a second switching element S2, and may supply a driving current for light emission to the organic light emitting display 400. The amount of current of the drive transistor M1 may be controlled by a data voltage applied through a first switching element S1. A capacitive element C1 for maintaining the applied data current for a certain period may be connected between a source and a gate of the drive transistor M1. A first electrode of the first switching element S1 may be connected with a data line Data[m], and a control electrode may be connected with a scan line Scan[n]. The second switching element S2 may transfer the current supplied from the drive transistor M1 to the organic light emitting display 400 by a light emission control signal. A third switching element S3 may be connected with the previous scan line Scan[n] and may initialize a storage voltage of the capacitive element C1 to an initialization voltage Vinit.

In operation of the pixel circuit 441 having the above-mentioned structure, if the first switching element S1 is turned on by a scan signal applied to the control electrode of the first switching element S1, then the data voltage may be applied from the data line Data[m] to the control electrode of the drive transistor M1. Then, in correspondence to a voltage $V_{GS}$ charged between the gate and the source by the capacitive element C1, a driving current $I_{OLED}$ may flow through a drain of the drive transistor M1. Furthermore, if the second switching element S2 is turned on by the light emission control signal, then the organic light emitting display 400 may be supplied with the driving current $I_{OLED}$, and may emit light.

Figure 4:
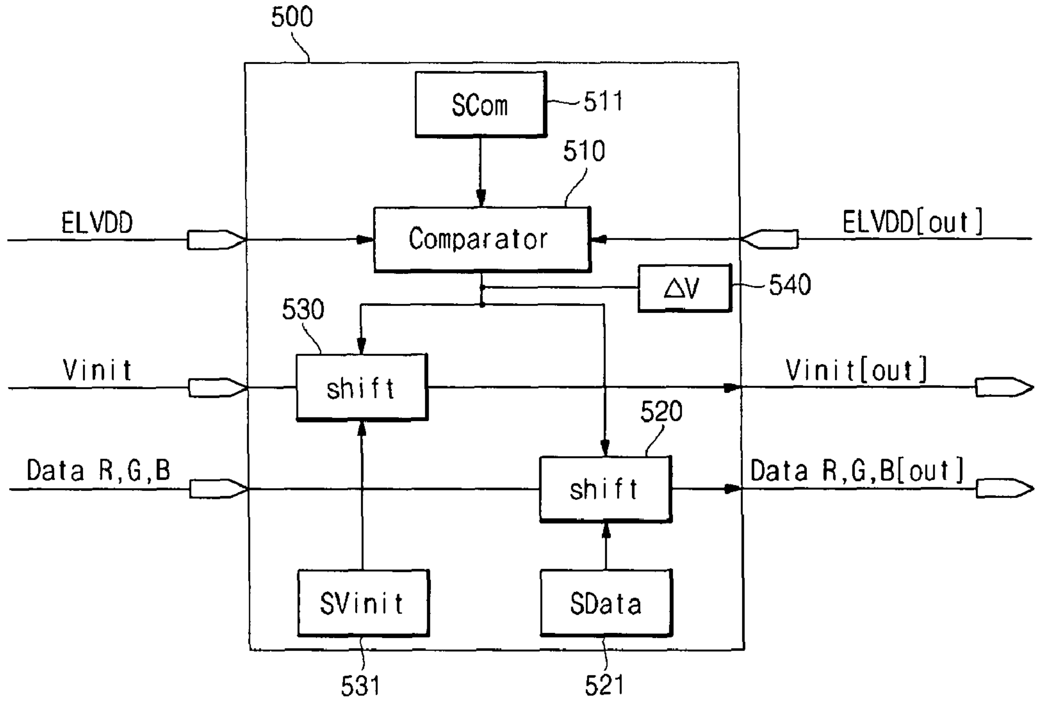
FIG. 4 illustrates a block diagram of a detection compensation device of a substrate testing device according to an exemplary embodiment.

FIG. 4 illustrates a block diagram of a detection compensation device 500 of a substrate testing device 1000 according to an example embodiment.

Referring to FIG. 4, the detection compensation device 500 may include a comparator 510, a level shifter 520, an initialization level shifter 530, a comparator switch 511, a voltage switch 521, an initialization switch 531 and a voltage difference holder 540.

The comparator 510 may generate a voltage difference ΔV between a power supply voltage ELVDD and a power supply voltage ELVDD[n], which may be dropped by a voltage drop IR Drop and supplied from the display panel 440.

The level shifter 520 may receive a data voltage DataR,G,B and the voltage difference ΔV. The level shifter 520 may further compensate the data voltage DataR,G,B with a voltage as much as the voltage difference ΔV, so as to output a data voltage DataR,G,B [out] (hereinafter referred to as a "compensated data voltage"), which may be applied to the display panel 440.

The initialization level shifter 530 may receive an initialization voltage Vinit and the voltage difference ΔV. The initialization level shifter 530 may compensate the initialization voltage Vinit with a voltage as much as the voltage difference ΔV, so as to output an initialization voltage Vinit[out] (hereinafter referred to as a "compensated initialization voltage"), which may be applied to the display panel 440.

The comparator switch 511 may switch on or off the comparator 510, so as to selectively output the voltage difference ΔV or the power supply voltage ELVDD[n], which may be dropped by the voltage drop IR Drop. The power supply voltage ELVDD[n] may be supplied from the display panel 440.

The voltage switch 521 may switch on or off the level shifter 520, so as to selectively output the compensated data voltage DataR,G,B[out], which may be produced by compensating the data voltage DataR,G,B with a voltage as much as the voltage difference ΔV or the applied data voltage DataR,G,B. The compensated data voltage DataR,G,B[out] may be applied to the display panel 440.

The initialization switch 531 may switch on or off the initialization level shifter 530, so as to selectively output the compensated initialization voltage Vinit[out], which may be produced by compensating the initialization voltage Vinit with a voltage as much as the voltage difference ΔV or the applied initialization voltage Vinit. The compensated initialization voltage Vinit[out] may be applied to the display panel 440.

The voltage difference holder 540 may output a constant voltage by holding the voltage difference ΔV of an average value when a noise occurs in the power supply voltage ELVDD. Furthermore, in case of a small deviation of the brightness for the respective panels, the voltage difference holder 540 may hold the voltage difference ΔV value after initially detecting the voltage difference ΔV value. As a result, the voltage difference holder 540 may apply the voltage difference ΔV value to all display panels 440.

The detection compensation device 500 may be installed in a substrate testing device so as to test the substrate by utilizing a separate device. Alternatively, the detection compensation device 500 may be integrated into the same substrate as the display panel 440, and may also test the substrate without using a separate device. Furthermore, the detection compensation device 500 may measure and compensate a brightness difference produced by the voltage drop IR Drop of each display panel 440 not separately but by the detection compensation device 500.

For example, if there is no voltage drop IR Drop in the pixel circuit 441 (as shown in FIG. 3), then the organic light emitting display may be supplied with a current $I_{OLED}$, which may correspond to a voltage charged in a capacitive element C1, e.g., a gate-source voltage $V_{GS}$ of a drive transistor M1. The current $I_{OLED}$ may be as follows:

$$\begin{aligned} I_{OLED} &= \frac{\beta}{2}(V_{GS} - V_{TH})^2 \\ &= \frac{\beta}{2}(V_{GS} - |V_{TH}|)^2 \\ &= \frac{\beta}{2}(V_{DD} - V_{DATA} - |V_{TH}|)^2 \end{aligned}$$

where $V_{TH}$ may be a threshold voltage of the first drive transistor, $V_{DATA}$ may be a data voltage, $V_{DD}$ may be a power supply voltage supplied from the power supply line ELVDD, and β may be a constant.

If there is a voltage drop IR Drop, then the $I_{OLED}$ of the pixel circuit 441, which may be driven by a voltage compensated by the detection compensation device 500 may be as follows:

$$\begin{aligned} I_{OLED} &= \frac{\beta}{2}(V_{DD[n]} - V_{DATA[out]} - |V_{TH}|)^2 \\ &= \frac{\beta}{2}([V_{DD} - \Delta V] - [V_{DATA} - \Delta V] - |V_{TH}|)^2 \\ &= \frac{\beta}{2}([V_{DD} - V_{DATA} - |V_{TH}|)^2 \end{aligned}$$

where $V_{DD}$[n] may be a power supply voltage ELVDD[n] dropped by the voltage drop IR Drop, $V_{DATA[out]}$ may be a compensated data voltage DataR,G,B[out], which may be produced by compensating a data voltage with a voltage as much as a voltage difference ΔV dropped by the voltage drop IR Drop. In other words, if the data voltage is compensated with a voltage as much as the voltage difference ΔV (when the power supply voltage ELVDD is dropped by the voltage difference ΔV), then it may be possible to obtain the same $I_{OLED}$ as when there is no voltage drop IR Drop. The compensated data voltage DataR,G,B[out] may be a data voltage, which may compensate all of a red data voltage, a green data voltage and a blue data voltage. Furthermore, if the initialization voltage Vinit is compensated with a voltage as much as the voltage difference ΔV (when the power supply voltage ELVDD is dropped by the voltage difference ΔV upon applying the initialization voltage Vinit (as shown in FIG. 3) to the display panel 440), then it may be possible to apply the same current as when there is no voltage drop IR Drop to the capacitive element C1. As a result, it may be possible to identically initialize the capacitive element C1 of each display panel 440. In other words, the detection compensation device 500 may reduce a considerable amount of time required for measuring the brightness of each display panel 440, and thus, control and compensate the data voltage DataR,G,B and the initialization voltage Vinit, respectively, to compensate the brightness of each display panel 440.

Figure 5:
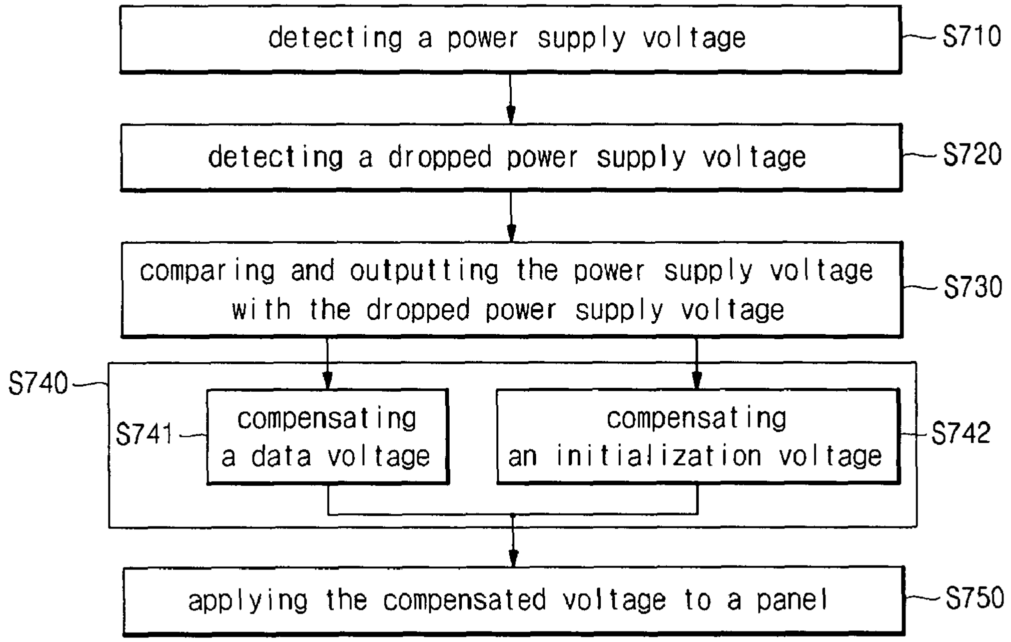
FIG. 5 illustrates a flow chart of a substrate testing method according to an exemplary embodiment.

FIG. 5 illustrates a flow chart of a substrate testing method according to an example embodiment. Referring to FIG. 5, the substrate testing method may include detecting a power supply voltage S710, detecting a dropped power supply voltage S720, comparing and outputting the power supply voltage with the dropped power supply voltage S730, compensating a voltage S740, and applying a compensated voltage to a panel S750.

Detecting the power supply voltage S710 may detect a power supply voltage without a voltage drop IR Drop in the comparator 510 of the detecting compensation device 500 (as shown in FIG. 4).

Detecting the dropped power supply voltage S720 may detect a dropped power supply voltage, which may be a power supply voltage applied to any display panels 440, and may be dropped by the voltage drop IR Drop in the comparator 510 of the detection compensation device 500.

Comparing and outputting the power supply voltage with the dropped power supply voltage S730 may compare the power supply voltage with the dropped power supply voltage in the comparator 510 of the detection compensation device 500, and may output the voltage difference ΔV between two voltages. The voltage difference ΔV may be the same voltage as the voltage dropped by the voltage drop IR Drop. Furthermore, comparing and outputting the power supply voltage with the dropped power supply voltage S730, may selectively output the voltage difference between two voltages or the dropped power supply voltage, which may be dropped by the voltage drop IR Drop, and may be applied from the panel by switching on or off the comparator 501. Moreover, it may be possible to output a constant voltage by holding the voltage difference ΔV of an average value when a noise occurs in the power supply voltage. Further, in case of a small deviation of the brightness for each display panel 440, it may be possible to hold the voltage difference value ΔV after initially detecting the voltage difference value ΔV, and apply the voltage difference ΔV value to all display panels 440.

Compensating the voltage S740 may include compensating a data voltage S741 and/or compensating an initialization voltage S742. Compensating the data voltage S741 may include outputting a compensated data voltage, which may be produced by compensating the data voltage applied to the display panel 440 with a voltage as much as the voltage difference ΔV output from the comparator 510 and the output of the power supply voltage with the dropped power supply voltage S730 (or the applied data voltage applied to the organic light emitting display 400). The compensated data voltage may be applied to the organic light emitting display 400. Moreover, compensating the initialization voltage S742 may output a compensated initialization voltage, which may be produced by compensating the initialization voltage Vinit applied to the organic light emitting display 400 with a voltage as much as the voltage difference ΔV output from the comparator 510 and the output of the power supply voltage with the dropped power supply voltage in S730. Further, it may be possible to output the compensated initialization voltage to the applied initialization voltage Vinit, and thus, apply the voltage to the organic light emitting display.

In applying the compensated voltage to the panel S750, the compensated data voltage and the compensated initialization voltage (which may be compensated in S740), may be applied to each display panel 440. As a result, each display panel 440 may emit light with the same brightness.

As described above, the substrate testing device and method thereof according to exemplary embodiments may have an advantageous effect, e.g., the measurement and compensation of the brightness may be performed by the detection compensation device without measuring the brightness of each panel.

Another advantageous effect may be that when the circuit wiring constituting the panel is changed (or a size of the panel is changed), the measurement and compensation of the brightness may be performed by the detection compensation device without repeatedly measuring the brightness.

Another advantageous effect may be that it may be possible to test the substrate by the detection compensation device integrated into the substrate without a separate equipment, e.g., a substrate test equipment, for testing the panel.

Examples of Organic Light Emitting Elements

Figure 6:
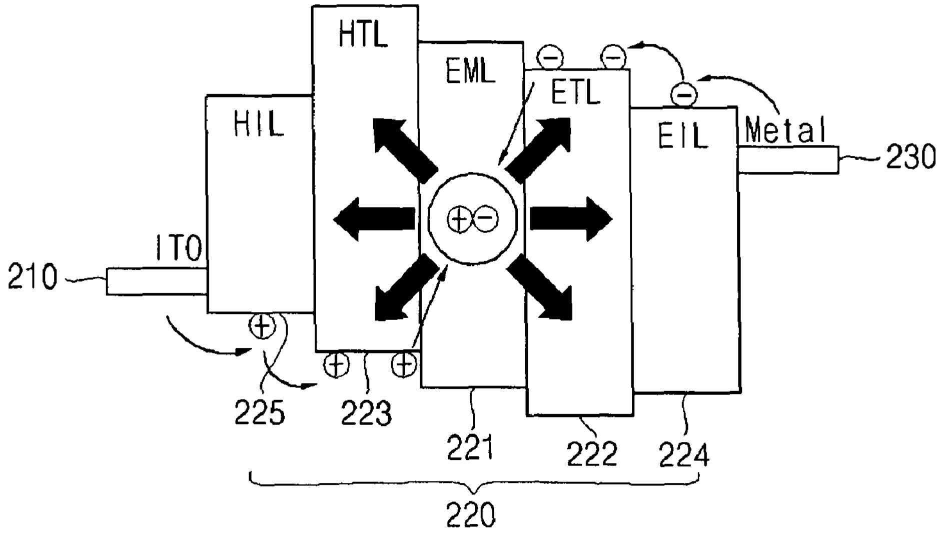
FIG. 6 illustrates a conceptual view of an organic light emitting element.
Figure 7:
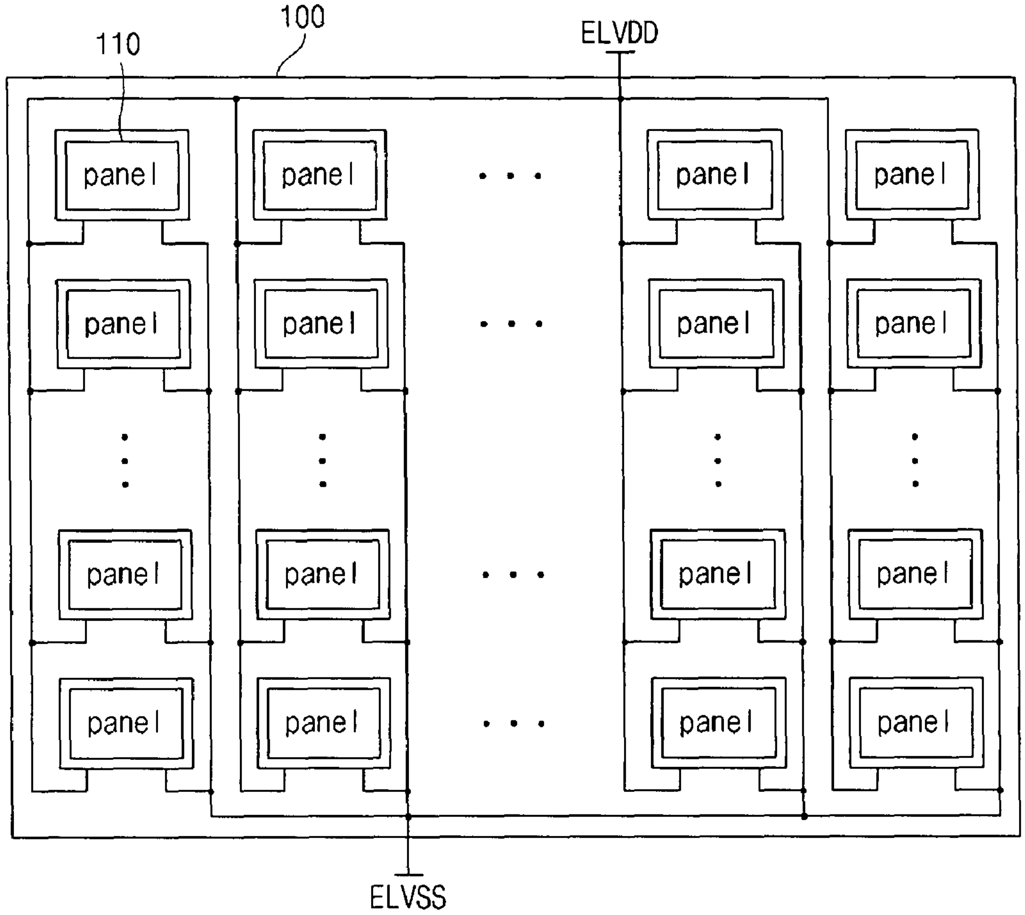
FIG. 7 illustrates a view of a substrate for a conventional organic light emitting display.

FIG. 6 illustrates a conceptual view of an organic light emitting element 200. Referring to FIG. 6, an organic light emitting element 200 may included an anode 210, a cathode 230, and an organic layer 220. The anode 210 may be a transparent electrode, e.g., an indium tin oxide (ITO). The cathode 230 may be an opaque electrode, e.g., a metal electrode. The organic layer 220 may include an emitting layer (EML) 221, which may emit light by coupling an electron and a hole, an electron transport layer (ETL) 222, which may transport the electron, and a hole transport layer (HTL) 223, which may transport the hole. Further, an electron injecting layer (EIL) 224, which may inject the electron, may be formed on one side of the electron transport layer ETL 222, and a hole injecting layer (HIL) 225, which may inject the hole formed on one side of the hole transport layer HTL 223.

In another exemplary embodiment, i.e., in case of a phosphorescent organic light emitting element, a hole blocking layer (HBL) (not shown) may be selectively formed between the emitting layer EML 221 and the electron transport layer ETL 222, and an electron blocking layer (EBL) (not shown) may be selectively formed between the emitting layer EML 221 and the hole transport layer HTL 223.

Further, the organic layer may be formed as a slim organic light emitting display by mixing two kinds of layers into a single layer, thereby reducing the thickness. For example, it may be possible to selectively form a hole injection transport layer HITL (not shown) by forming the hole injecting layer HIL 225 and the hole transport layer HTL 223 simultaneously, or an electron injection transport layer EITL (not shown) by forming the electron injecting layer EIL 224 and the electron transport layer ETL 222 simultaneously. The slim organic light emitting display may be used to increase the light emission efficiency.

Buffer layers (not shown) may optionally be formed between the anode 210, the emitting layer EML 221, and the cathode 230. The buffer layers may be classified as an electron buffer layer (EBL) for buffering an electron and a hole buffer layer (HBL) for buffering a hole. The EBL may be selectively formed between the cathode 230 and the electron injecting layer (EIL) 224, and may replace the electron injecting layer EIL 224. As a result, the stack structure of the organic layer may be the EML/ETL/EBL/cathode. Furthermore, the HBL may be selectively formed between the anode 210 and the hole injecting layer HIL 225, and may replace the HIL 225. As a result, the stack structure of the organic layer may be the anode/HBL/HTL/EML.

It is appreciated that other possible stack structures may be employed. For example, the stacked structure may be a normal stack structure, a normal slim structure, an inverted stack structure and an inverted slim structure.

In the normal stack structure, the structure may be: (a) an anode/hole injecting layer/hole transport layer/emitting layer/electron transport layer/electron injecting layer/cathode; (b) an anode/hole buffer layer/hole injecting layer/hole transport layer/emitting layer/electron transport layer/electron injecting layer/cathode; (c) an anode/hole injecting layer/hole transport layer/emitting layer/electron transport layer/electron injecting layer/electron buffer layer/cathode; (d) an anode/hole buffer layer/hole injecting layer/hole transport layer/emitting layer/electron transport layer/electron injecting layer/electron buffer layer/cathode; (e) an anode/hole injecting layer/hole buffer layer/hole transport layer/emitting layer/electron transport layer/electron injecting layer/cathode; and/or (f) an anode/hole injecting layer/hole transport layer/emitting layer/electron transport layer/electron buffer layer/electron injecting layer/cathode.

In the normal slim structure, the structure may be: (a) an anode/hole injection transport layer/emitting layer/electron transport layer/electron injecting layer/cathode; (b) an anode/hole buffer layer/hole injection transport layer/emitting layer/electron transport layer/electron injecting layer/cathode; (c) an anode/hole injecting layer/hole transport layer/emitting layer/electron injection transport layer/electron buffer layer/cathode; (d) an anode/hole buffer layer/hole transport layer/emitting layer/electron injection transport layer/electron buffer layer/cathode; (e) an anode/hole injection transport layer/hole buffer layer/emitting layer/electron transport layer/electron injecting layer/cathode; and/or (f) an anode/hole injecting layer/hole transport layer/emitting layer/electron buffer layer/electron injection transport layer/cathode In the inverted stack structure, the structure may be: (a) a cathode/electron injecting layer/electron transport layer/emitting layer/hole transport layer/hole injecting layer/anode; (b) a cathode/electron injecting layer/electron transport layer/emitting layer/hole transport layer/hole injecting layer/hole buffer layer/anode; (c) a cathode/electron buffer layer/electron injecting layer/electron transport layer/emitting layer/hole transport layer/hole injecting layer/anode; (d) a cathode/electron buffer layer/electron injecting layer/electron transport layer/emitting layer/hole transport layer/hole buffer layer/anode; (e) a cathode/electron injecting layer/electron transport layer/emitting layer/hole transport layer/hole buffer layer/hole injecting layer/anode; and/or (f) a cathode/electron injecting layer/electron buffer layer/electron transport layer/emitting layer/hole transport layer/hole injecting layer/anode.

In the inverted slim structure, the structure may be: (a) a cathode/electron injecting layer/electron transport layer/emitting layer/hole injection transport layer/anode; (b) a cathode/electron injecting layer/electron transport layer/emitting layer/hole injection transport layer/hole buffer layer/anode; (c) a cathode/electron buffer layer/electron injection transport layer/emitting layer/hole transport layer/hole injecting layer/anode; (d) a cathode/electron buffer layer/electron injection transport layer/emitting layer/hole transport layer/hole buffer layer/anode; (e) a cathode/electron injecting layer/electron transport layer/emitting layer/hole buffer layer/hole injection transport layer/anode; and/or (f) a cathode/electron injection transport layer/electron buffer layer/emitting layer/hole transport layer/hole injecting layer/anode.

The organic light emitting display may be driven by a passive matrix method or an active matrix method. The passive matrix method may have an advantageous effect of, for example, simple manufacturing process and less investment cost due to the anodes intersecting the cathodes so as to select and drive a line. However, the passive matrix method may have a high current consumption when embodied in a wide screen format. The active matrix method may have an advantageous effect of, for example, a low current consumption, excellent image quality, long service life, and applicability to medium and large sized product by using an active element, e.g., a thin film transistor (TFT) and a capacitive element for each pixel.

In the active matrix method, the structure of the pixel circuit of the organic light emitting display and the TFT may be a significant factor in the operation thereof. In the active matrix method, the TFT may be crystallized. One method for crystallizing the TFT may include at least one of: (a) a laser crystallization method using an excimer laser, for example, which may crystallize into a polycrystalline silicon; (b) a metal induced crystallization (MIC) method using a metal promoting material; and (c) a sold phase crystallization (SPC) method. Moreover, there may also be a high pressure annealing (HPA) method, which may perform crystallization under an atmosphere of high temperature and humidity. Further, a sequential lateral solidification (SLS) method may be used, which may use a mask in addition to an existing laser crystallization method.

Another method may be a crystal grain method, which may crystallize into a micro-silicon having a crystal grain size between an amorphous silicon (a-Si) and a polycrystalline silicon, may include a thermal crystallization method and a laser crystallization method. The micro-silicon may typically refer to a silicon having a crystal grain size smaller than that of the polycrystalline silicon, e.g., approximately 1 nm to 100 nm. Further, the micro-silicon may have an electron mobility from approximately 1 to 50 and a hole mobility from approximately 0.01 to 0.2. Furthermore, a protrusion area between crystal grains of the micro-silicon may be smaller than that of a polycrystalline silicon, and thus, electron movement between the crystal grains may not be hindered so as to exhibit uniform characteristics.

The thermal crystallization method, which may crystallize into the micro-silicon, may obtain a crystallization structure simultaneously with the deposition of the amorphous silicon (a-Si) and a reheating method.

The laser crystallization method, which may crystallize into the micro-silicon, may use a laser, e.g., a diode laser, after depositing the amorphous silicon (a-Si) by a chemical vapor deposition method, for example. The laser may use a red wavelength of approximately 800 nm range, whereby the red wavelength may allow the micro-silicon to be uniformly crystallized.

The laser crystallization method, which may crystallize into the polycrystalline silicon, may be the most efficient method among crystallization methods so as to crystallize the TFT into the polycrystalline silicon. It is appreciated that using the existing crystallization method of a polycrystalline liquid crystal display may provide a simple and complete process.

The MIC method, which may crystallize into the polycrystalline silicon, may crystallize at a low temperature without using the laser crystallization method. The MIC method may have an advantageous effect that a metal promoting material, such as, but not limited to, Ni, Co, Pd and/or Ti, may be initially deposited or spin-coated on the surface of the amorphous silicon (a-Si), and then the metal promoting material may directly penetrate into the surface of the amorphous silicon (a-Si). This results in crystallizing the amorphous silicon (a-Si) at a low temperature while changing the phase thereof.

The MIC method, which may use a mask when applying a metal layer on the surface of the amorphous silicon (a-Si), may further prevent a contaminant, e.g., a nickel silicide, from depositing on a specific area of the TFT. This crystallization method may be referred to as a metal induced lateral crystallization (MILC) method. The mask used for the MILC method may be a shadow mask, in which the shadow mask may be a linear mask or a dotted mask, for example.

Another method may be a metal induced crystallization with a capping layer (MICC) method, which may apply the capping layer on the surface of the amorphous silicon (a-Si) before depositing or spin-coating the metal promoting material layer thereon. The MICC method may control the amount of the metal promoting material induced into the amorphous silicon (a-Si). It should be appreciated that the capping layer may be a silicon nitride layer. The amount of the metal promoting material entered into the amorphous silicon (a-Si) from the metal promoting material layer may vary depending on the thickness of the silicon nitride layer. That is, the metal promoting material entered into the silicon nitride layer may be formed on the whole silicon nitride layer or may be selectively formed by using the shadow mask. After the metal promoting material layer crystallizes the amorphous silicon (a-Si) into the polycrystalline silicon, it may be possible to selectively remove the capping layer. Methods for removing the capping layer may include a wet etching method or a dry etching method. Furthermore, after the polycrystalline silicon is formed, a gate insulating layer may be formed and a gate electrode may be formed on the gate insulating layer. An insulating interlayer may be formed on the gate electrode. After forming a via hole on the insulating interlayer, it may be possible to inject impurities through the via hole onto the crystallized polycrystalline silicon and additionally remove the inner metal promoting material impurities (this may be referred to as a gettering process). In the gettering process, there may be a process of injecting the impurities as well as a heating process of heating the TFT at a low temperature. The gettering process may embody a TFT of good quality.

Exemplary embodiments of the present invention have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A substrate testing device detecting a defect in image quality of a display panel being tested for the defect in image quality, the substrate testing device, comprising:

a comparator comparing a power supply voltage supplied by a power supply voltage line to the display panel being tested for the defect in image quality with a dropped power supply voltage detected by a power supply voltage detection line from the display panel being tested for the defect in image quality, and the comparator outputting a voltage difference; and a level shifter circuit compensating a data voltage with a voltage up to an amount equal to the voltage difference output from the comparator, and supplying the data voltage to the display panel being tested for the defect in image quality.

2. The substrate testing device as claimed in claim 1, further comprising:

an initialization level shifter circuit compensating an initialization voltage with a second voltage up to an amount equal to the voltage difference output from the comparator, and supplying the initialization voltage to the display panel being tested for the defect in image quality.

3. The substrate testing device as claimed in claim 2, wherein:

the initialization level shifter circuit receives the voltage difference from the comparator, and the initialization voltage is a voltage is transferred to a pixel circuit of the display panel being tested for the defect in image quality.

4. The substrate testing device as claimed in claim 2, wherein the display panel being tested for the defect in image quality is electrically connected with the power supply voltage, the initialization voltage, and the data voltage.

5. The substrate testing device as claimed in claim 4, wherein the power supply voltage detection line is electrically connected with the power supply voltage line of the display panel being tested for the defect in image quality.

6. The substrate testing device as claimed in claim 1, wherein:

the level shifter circuit receives the data voltage from the comparator, and the data voltage is a voltage transferred to a pixel circuit of the display panel being tested for the defect in image quality.

7. The substrate testing device as claimed in claim 1, further comprising:

a substrate on which a plurality of display panels are arranged in a matrix, wherein the substrate testing device detects the defect in image quality in at least one of the plurality of display panels on the substrate.

8. The substrate testing device as claimed in claim 7, wherein the comparator, the level shifter circuit and the initialization level shifter circuit are integrated into the substrate.

9. The substrate testing device as claimed in claim 4, wherein the data voltage is at least one of a red data voltage, a green data voltage, and a blue data voltage.

10. The substrate testing device as claimed in claim 1, further comprising a comparator switch for switching the comparator.

11. The substrate testing device as claimed in claim 1, further comprising a voltage switch for switching the level shifter circuit.

12. The substrate testing device as claimed in claim 2, further comprising an initialization switch for switching the initialization level shifter circuit.

13. The substrate testing device as claimed in claim 1, further comprising a voltage difference holder for holding a voltage output from the comparator.

14. A substrate testing method for detecting a defect in image quality of a display panel being tested for the defect in image quality, the substrate testing method comprising:

detecting a power supply voltage being supplied to the display panel from a power supply source during testing for the defect in image quality;

detecting a dropped power supply voltage from the display panel during testing for the defect in image quality;

comparing the power supply voltage with the dropped power supply voltage;

outputting an output voltage based on the comparison between the power supply voltage and the dropped power supply voltage during testing for the defect in image quality;

compensating a data voltage to be supplied to the display panel with a voltage up to an amount equal to the output voltage; and supplying a compensated data voltage that includes the data voltage and the voltage up to the amount equal to the output voltage to the display panel during testing for the defect in image quality.

15. The method as claimed in claim 14, wherein outputting the output voltage includes outputting a voltage difference between the power supply voltage with the dropped power supply voltage.

16. The method as claimed in claim 14, further comprising compensating an initialization voltage to be supplied to the display panel during testing for the defect in image quality with a second voltage up to an amount equal to the output voltage.

17. The method as claimed in claim 14, wherein compensating the data voltage compensates all of a red data voltage, a green data voltage and a blue data voltage.

18. The method as claimed in claim 14, wherein compensating the data voltage with a voltage up to an amount equal to the outputted voltage outputs the compensated data voltage which is produced by downshifting a voltage difference between the power supply voltage and the dropped power supply voltage in a level shifter.

19. The method as claimed in claim 14, further comprising switching the comparator after compensating the data voltage with a voltage up to an amount equal to the output voltage.

20. The method as claimed in claim 14, further comprising switching the level shifter circuit after compensating the data voltage with a voltage up to an amount equal to the output voltage.

21. The method as claimed in claim 16, further comprising switching the initialization level shifter after compensating the data voltage with a voltage up to an amount equal to the output voltage.

22. The method as claimed in claim 16, wherein compensating the initialization voltage with a voltage up to an amount equal to the output voltage outputs a compensated initialization voltage which is produced by downshifting a voltage difference between the power supply voltage and the dropped power supply voltage in an initialization level shifter.

23. The method as claimed in claim 14, further comprising comparing the power supply voltage with the dropped power supply voltage, and holding a voltage difference, so as to output a constant voltage after compensating the data voltage with a voltage up to an amount equal to the output voltage.

24. The method as claimed in claim 14, further comprising applying the compensated data voltage to the display panel during testing for the defect in image quality, after compensating the data voltage with a voltage up to an amount equal to the output voltage.

* * * * *